(12) United States Patent
Kumar et al.

(10) Patent No.: US 12,129,550 B1
(45) Date of Patent: Oct. 29, 2024

(54) THERMAL REACTOR FOR GENERATING REACTIVE SPECIES FOR CHEMICAL VAPOR DEPOSITION OF THIN FILMS

(71) Applicant: Pyxis Innovations Inc., Fremont, CA (US)

(72) Inventors: Atul Kumar, Santa Clara, CA (US); Minh Nguyen, Milpitas, CA (US)

(73) Assignee: Pyxis Innovations Inc., Fremont, CA (US)

( * ) Notice: Subject to any disclaimer, the term of this patent is extended or adjusted under 35 U.S.C. 154(b) by 9 days.

(21) Appl. No.: 17/543,711

(22) Filed: Dec. 6, 2021

Related U.S. Application Data

(60) Provisional application No. 63/121,948, filed on Dec. 6, 2020.

(51) Int. Cl.
*C23C 16/52* (2006.01)
*C23C 16/448* (2006.01)
*C23C 16/46* (2006.01)

(52) U.S. Cl.
CPC ............ *C23C 16/46* (2013.01); *C23C 16/448* (2013.01); *C23C 16/52* (2013.01)

(58) Field of Classification Search
CPC ........ C23C 16/45; C23C 16/448; C23C 16/52
See application file for complete search history.

(56) References Cited

U.S. PATENT DOCUMENTS

| | | | | |
|---|---|---|---|---|
| 5,267,390 A | * | 12/1993 | Yang | ................... C23C 16/0272 427/255.6 |
| 5,389,152 A | * | 2/1995 | Thurston | ............... C23C 16/045 427/244 |
| 2002/0041967 A1 | * | 4/2002 | Nakamura | ............ C03C 17/256 428/689 |
| 2005/0274322 A1 | | 12/2005 | Lee et al. | |
| 2010/0275514 A1 | * | 11/2010 | Paganessi | ................... C10J 3/08 48/209 |
| 2013/0286567 A1 | * | 10/2013 | Sorenson | ................ B08B 17/06 361/679.01 |

* cited by examiner

*Primary Examiner* — Joseph A Miller, Jr.
(74) *Attorney, Agent, or Firm* — Patent Law Works LLP

(57) ABSTRACT

A remote chemical vapor deposition ("CVD") reactor and process is disclosed, which includes a vacuum insulated inner core with an inlet that is connected to vapor inlet source and an outlet connected to a deposition chamber or a secondary reactor unit. The inner core may be heated to high temperatures by any of different energy sources, allowing for breaking of chemical bonds in the flowing vapor molecules and resulting in generating vapor phase reactive intermediates that are ultimately transported to a vacuum chamber for depositing thin films by the CVD process.

10 Claims, 8 Drawing Sheets

THERMAL REACTOR FOR GENERATING REACTIVE SPECIES FOR CHEMICAL VAPOR DEPOSITION OF THIN FILMS

REFERENCE TO RELATED APPLICATIONS

This application claims priority from Provisional Application No. 63/121,948, titled "Thermal Reactors for Generating Reactive Species for Chemical Vapor Deposition of Thin Films," filed on Dec. 6, 2020, the entirety of which is incorporated herein by reference.

BACKGROUND

1. Field of the Invention

The present invention relates generally to the field of chemical vapor deposition ("CVD") of thin films. In particular, the present invention relates to an apparatus or device and process for performing the chemical vapor deposition coating. More particularly, the present invention relates to a hardware design for a thermal reactor that is used for generating reactive species for the chemical vapor deposition coating of thin films.

2. Description of the Related Art

Chemical vapor deposition ("CVD") describes a group of thin film deposition techniques in which a substrate is typically placed into a vacuum chamber and one or more chemical precursors are activated and transported to the deposition chamber. In some instances, the chemical species may be activated in the deposition chamber, either thermally or through other means such as plasma activation. When the reactive species meet on the substrate surface, a chemical reaction occurs to form a high-performance thin film coating. Chemical vapor deposition is used to create coatings for a wide variety of applications including for medical devices, automotive components and silicon wafers.

There are a myriad benefits of current chemical vapor deposition methods, which include the ability to use these processes on a wide variety of substrates, as well as the ability to coat intricate or complex topographies. Thin films created by chemical vapor deposition typically maintain their bonds well in high-stress environments. As some examples, thin film coatings are used in a wide range of applications for many purposes. They may be used to protect displays from scratches or environmental exposure, create a specific degree of reflectivity on a lens or build layers of metallization on semiconductor wafers. Thin film coatings are also widely used in opto-electronics and displays, semiconductors, medicine and healthcare, and microscopy etc. In many applications, including in opto-electronics, precise, uniform thin films are critical. Thin films are critical in applications such as fiber optic lasers for telecommunication and wireless communication systems, fiber lasers for metal cutting, consumer electronics, laser diodes for three-dimensional ("3D") sensing, Light-Emitting Diode ("LED")/Organic Light-Emitting Diode ("OLED") displays, or the like.

As is recognized by those familiar with chemical vapor deposition. "pyrolyzers" are used in the deposition of parylene (para-xylylene) thin films. Pyrolyzers are typically units that contain heated surfaces or filaments, which heats up to a certain temperature depending on the target gas. When in contact with the heated surfaces or filaments, a gas converts or decomposes to chemically reactive species, another gas, or to different other gases. The general purpose of the pyrolyzer unit is to convert electrochemically inactive gases to reactive species, which can chemically react in the deposition chamber to form thin films. Parylene is a polymer that is often applied to electronic circuits and other equipment as for electrical insulation, moisture barriers or protection against corrosion and chemical attack.

Commercial tubular thermal reactors or pyrolyzers are recognized in the industry. For example, there are pyrolyzers used in the deposition of parylene thin films from the precursor dimers, for example, $(CH_2\text{-}C_6H_4\text{---}CH_2)_2$ or other substituted dimers. Is should be recognized by those skilled in the art that a dimer exists in solid form and is later transformed into a gaseous form by heating the dimer material, followed by generation of reactive species in the pyrolyzer, and finally parylene thin films are formed in the deposition chamber, through a chemical vapor deposition (CVD) process. It should be noted that while most parylene deposition processes use solid dimers, this invention is also applicable to parylene deposition processes using liquid precursor sources. These pyrolyzer or reactor typically consist of a solid pyrolysis tube that is either constructed from metal, metal alloys, or quartz. In some cases, the pyrolysis tube is made from metals or metal alloys that use a thin quartz liner to prevent any reaction between the precursor molecules and metal surface at elevated temperatures, which may result in undesirable impurities in the resulting films. The reactors are typically heated using an external heat source such as a furnace type heater covering the central zone of the tube and operating between 600-750 C. The ends of the tubular reactors have to be normally maintained at temperatures less than 200 C, mostly less than 100 C, to ensure that vacuum coupling seals that connect the pyrolysis tube to the deposition chamber are not damaged. For a typical pyrolyzer length of 14-18 inches that is used in the parylene deposition systems, the temperature variation that results from the center of the hot tubular zone to the ends is often more than 400 C, which results in typically too much positional variation for complete thermal cracking of the dimer molecules.

One way to solve the problem in existing techniques lies in heating the pyrolysis tube to a higher temperature, for example, 800 degrees Celsius or higher. This may achieve higher degree of precursor cracking. However, at the higher temperatures within the pyrolysis tube, other bonds besides the dimer bonds will likely be broken. This may cause the formation of thick carbon deposits ("coke") within the pyrolysis tube, which can degrade the reactor performance and result in incomplete dimer to reactive monomer conversion. Moreover, large amounts of carbon deposits necessitate the cleaning of the reactor, limiting system operational time.

Furthermore, the presence of quartz liners inside the metal pyrolysis tube results in higher temperature gradients across the inner section (reaction zone) of the pyrolysis tube, as quartz generally has poor thermal conductivity. Therefore, this process adds even more inefficiency to the dimer conversion process.

There exists a continuing and dire need in the industry for improved chemical vapor deposition coating techniques and devices for the vast industrial uses that require this technology.

SUMMARY

The present technology overcomes the deficiencies and limitations of prior devices, machines and chemical vapor deposition coating techniques, at least in part by, providing a solution that solves existing drawbacks. The apparatus and process disclosed are advantageous in a number of respects.

The new technology described provides a new hardware design for thermal reactors that may be used for generating reactive species for chemical vapor deposition of thin films. One application of this thermal reactor design is suited for use in equipment for depositing various parylene (para-xylylene) polymer films. The novel approach to uniformly heating a central inner reaction core that spans almost the entire length of the reactor unit, while maintaining a sub-100° C., external flange temperatures provide several process and hardware benefits.

In accordance with one embodiment of the present invention, a remote chemical vapor deposition ("CVD") reactor and process comprises a vacuum insulated inner core with an inlet that is connected to a vapor inlet source and an outlet connected to a deposition chamber or a secondary reactor unit. The inner core may be heated to high temperatures by any of different energy sources, allowing for breaking of chemical bonds in the flowing vapor molecules and resulting in generating vapor phase reactive intermediates that are ultimately transported to a vacuum chamber for depositing thin films by this chemical vapor deposition coating process.

Applications include, but are not limited to, chemical vapor deposition and atomic layer deposition of thin films that use remote thermal activation for generating the reactive species. In particular, the chemical vapor deposition coating process may be used in medical applications to create a coating that resists attack better than other materials with functionality and durability.

BRIEF DESCRIPTION OF THE DRAWINGS

The present invention is illustrated by way of example, and not by way of limitation in the figures of the accompanying drawings in which like reference numerals are used to refer to the same or similar elements.

DETAILED DESCRIPTION

The apparatus and process of this technology provides remote chemical vapor deposition ("CVD") reactors, which include a vacuum insulated inner core with an inlet that is connected to vapor inlet source and an outlet that is connected to a deposition chamber or a secondary reactor unit. The inner core may be heated to high temperatures by any of different energy sources that are used, therefore, allowing for breaking of chemical bonds in the flowing vapor molecules and resulting in generating vapor phase reactive intermediates that are ultimately transported to a vacuum chamber for depositing thin films by the chemical vapor deposition process.

This disclosure describes a new hardware design for thermal reactors that may be used for generating reactive species for chemical vapor deposition of thin films. One potential application of this thermal reactor design is suited for use in equipment for depositing various parylene (para-xylylene) polymer films. The novel approach to uniformly heating a central inner reaction core that spans almost the entire length of the reactor unit, while maintaining sub-100° C., external flange temperatures provides several process and hardware benefits.

Other applications include, but are not limited to, chemical vapor deposition and atomic layer deposition of thin films that use remote thermal activation for generating the reactive species.

FIGS. 1, 2, 3 and 4 illustrate one embodiment of an apparatus or device hardware design in accordance with the present invention, which is a machine configured to be used for high-volume, large-scale manufacturing or alternatively, for small-batch operations in manufacturing. The apparatus 100 in accordance with the present invention is used for chemical vapor deposition coating to provide superior and effective results. Chemical vapor deposition technology is a thin film deposition technology that provides uniform, dense, and high-purity coatings with conformity over any surface, including complex three-dimensional surfaces. The chemical vapor deposition reaction parameters advantageously allow for control of the coating composition, crystallinity, defect density, and internal stresses.

Figure 1:
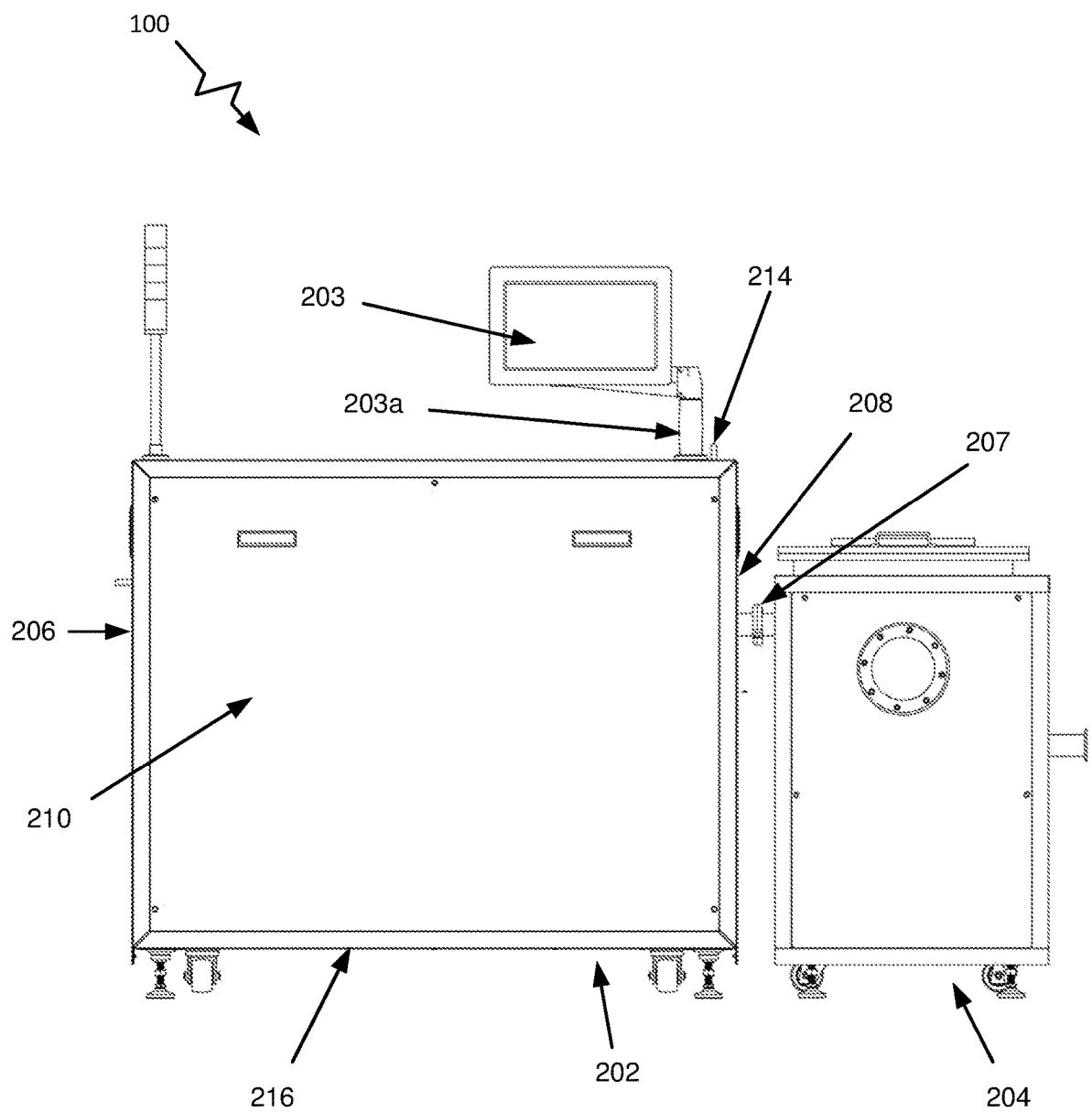
FIG. 1 is a front-view illustration of one embodiment of the chemical vapor coating device in accordance with the present invention.
Figure 4:
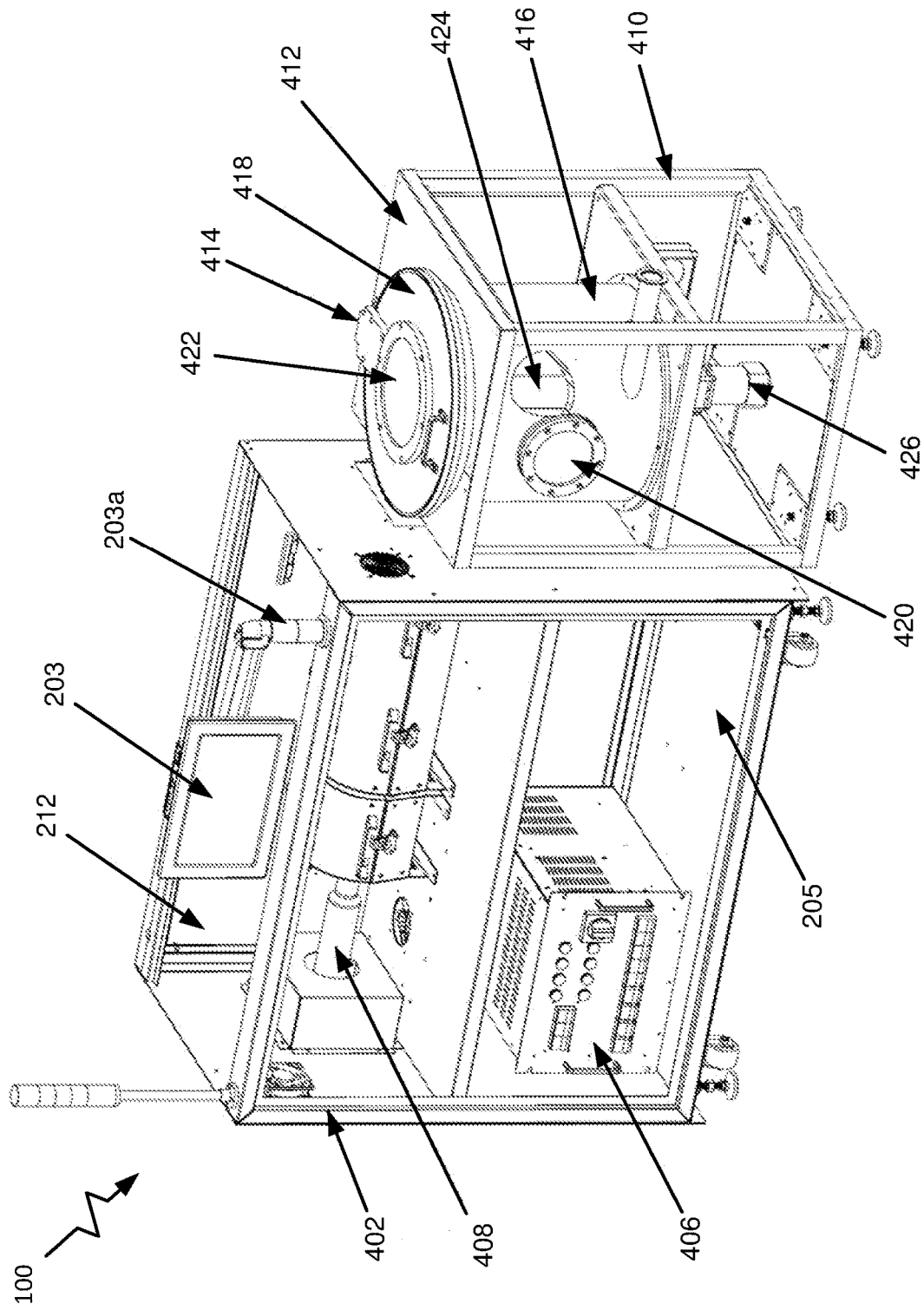
FIG. 4 is a diagrammatic isometric view of the chemical vapor coating device in accordance with the present invention.

Referring now to FIG. 1, which illustrates a planar view of the apparatus 100, in accordance with one embodiment of the hardware design, the apparatus 100 comprises two components that house the various apparatus parts, each machined and constructed to suitable sizes to perform respective individual functions of the apparatus 100. The apparatus 100 comprises two components. The first component 202 that has a substantially larger frame than the second component 204, which is positioned proximate the first component 202. The first component of the apparatus or machine 100 has four facing covers or walls that form an internal chamber 205 (see FIG. 4) within it. Other components are housed within the chamber 205. The side covers are indicated by reference numerals 206 and 208 and the front and rear covers are indicated by reference numerals 210 and 212 (the rear cover designated by reference numeral 212 is best illustrated in FIG. 4). The component 202 also has a roof cover 214 configured with gripping handles to allow an operator of the apparatus 100 to easily and safely lift it. The component 202 also has a floor 216.

Figure 2:
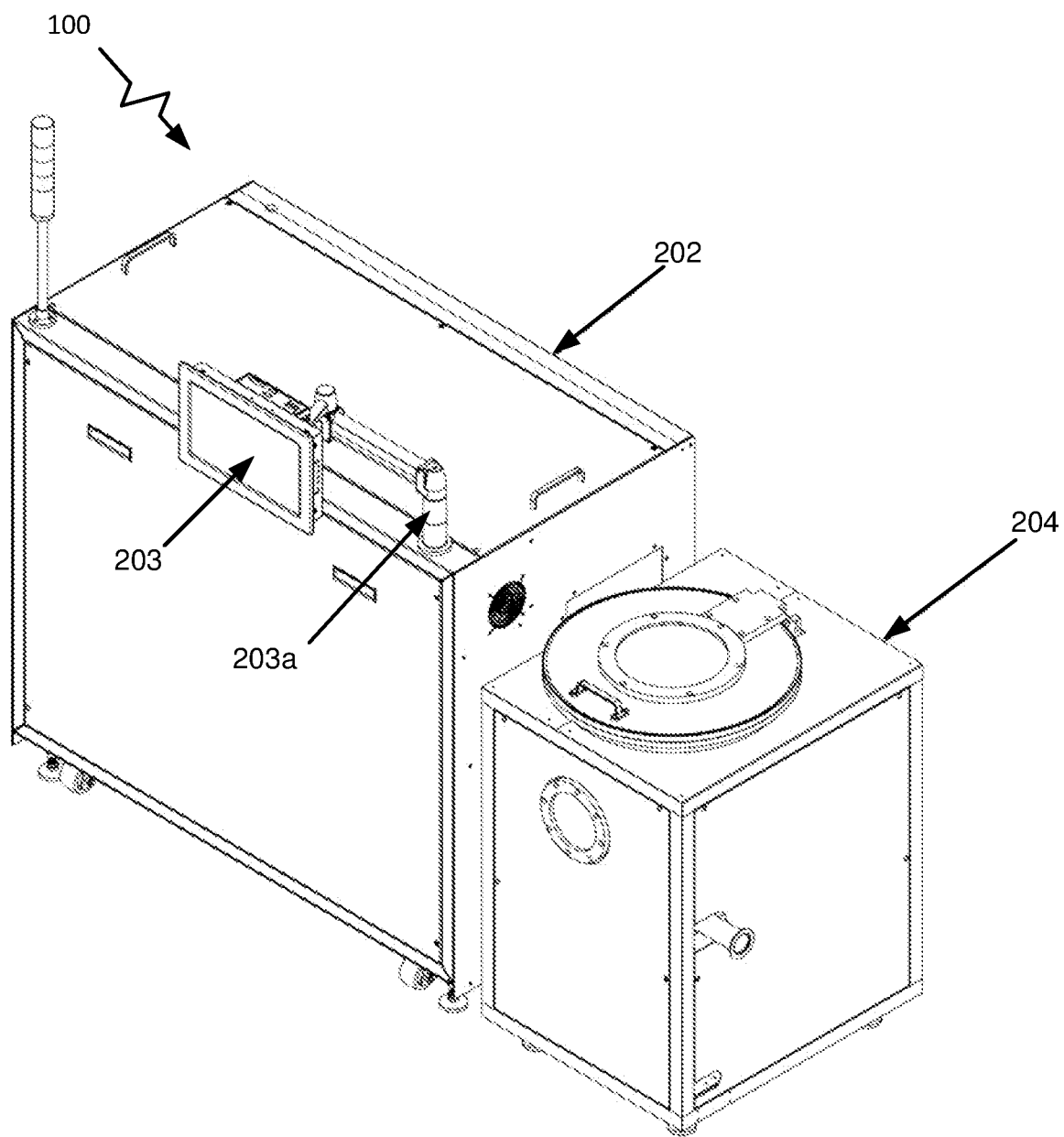
FIG. 2 is a projection view of the chemical vapor coating device in accordance with the present invention.
Figure 3:
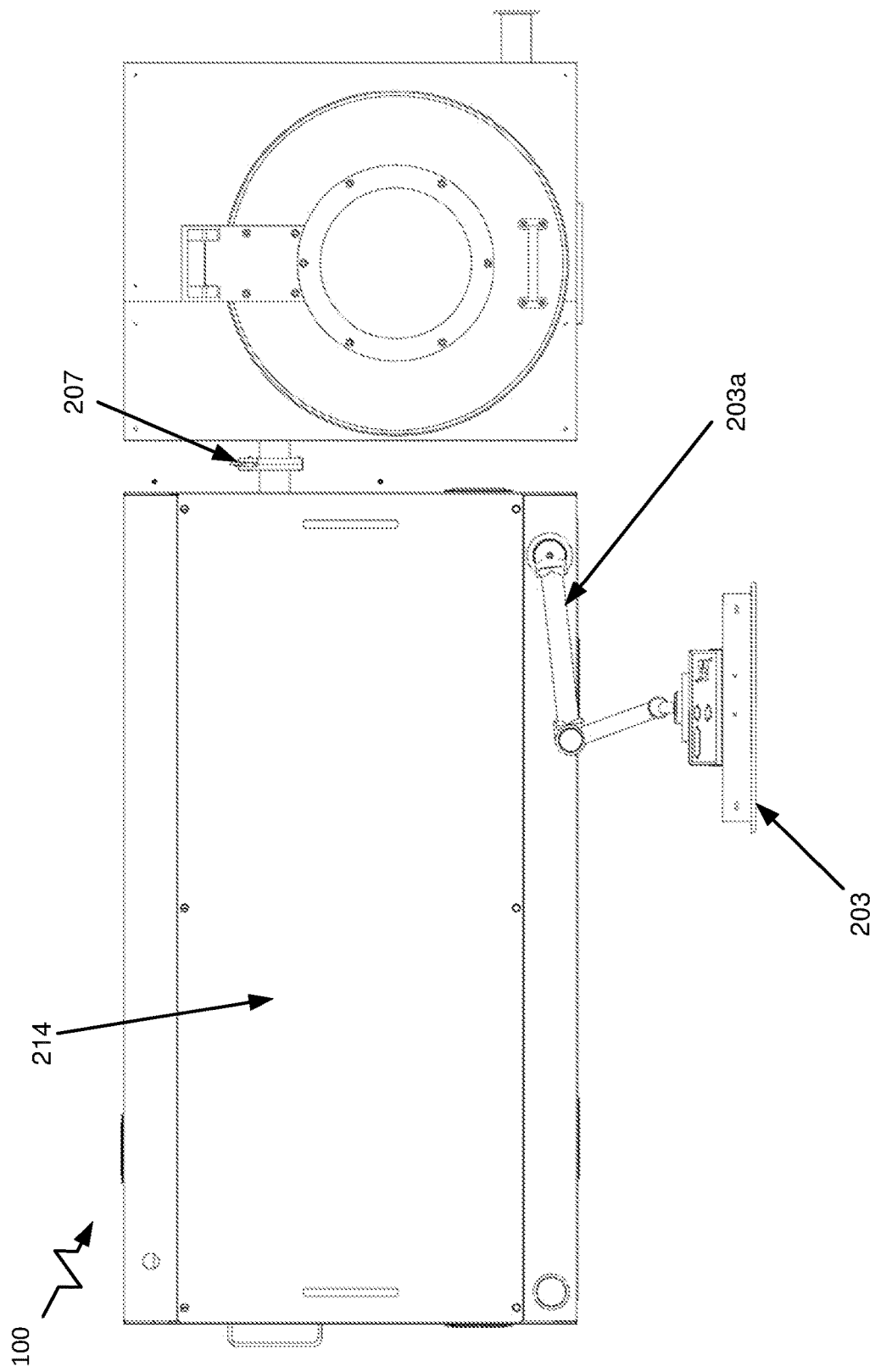
FIG. 3 is a top planar view of the chemical vapor coating device in accordance with the present invention.

FIG. 2 illustrates another perspective diagram of the first component 202 and the second component of the apparatus 100, positioned proximate each other and standing on short legs or wheels as desired for easy movement. FIG. 3 is a top planar view of the apparatus 100 illustrating the passage of the tube (described in greater detail below) connecting the first component 202 and the second component 204 through the connecting flange 207. It is important to note that this flange temperature has to be maintained below 200 C, preferably 100 C, as described earlier and is a limiting feature in conventional reactor designs. FIGS. 2 and 3 illustrate the dimensions of the various parts and the configuration. It should be recognized that variations of the apparatus 100 may be made and that the solution of the present invention can be implemented in other types of devices that may be constructed.

FIG. 4 illustrates that the first component 202 has a first assembly of parts as illustrated including a frame 402 for the rear cover 212, a reactor assembly. The first component 202 has a second assembly of parts as illustrated, including a kit with covers of the reactor assembly. The first component 202 further comprises a third assembly 406 of parts including an electrical box. The first component 202 further comprises a fourth assembly 408 of parts including a vaporizer. The second component 204 comprises a fifth assembly 410 of parts including a deposition chamber module frame. The second component 204 comprises a sixth assembly 412 of parts including a deposition chamber module frame. The second component 204 comprises a seventh assembly 414 of parts including a deposition chamber lift assembly. The second component 204 comprises an eighth assembly 416 of parts including a welded round deposition chamber. The second component 204 comprises a ninth assembly 418 of parts including a lid of the round deposition chamber. The second component 204 comprises a tenth assembly 420 of parts including a window or a side view port in the deposition chamber. The second component 204 comprises an eleventh assembly 422 of parts including a window or a top view port in the deposition chamber. The second component 204 comprises a twelfth assembly 424 of parts including a rotary tower used for moving parts inside the deposition chamber for maintaining film uniformity. The second component 204 comprises a thirteenth assembly 426 of parts including a motor and controller for rotating the rotary fixture.

Figure 5:
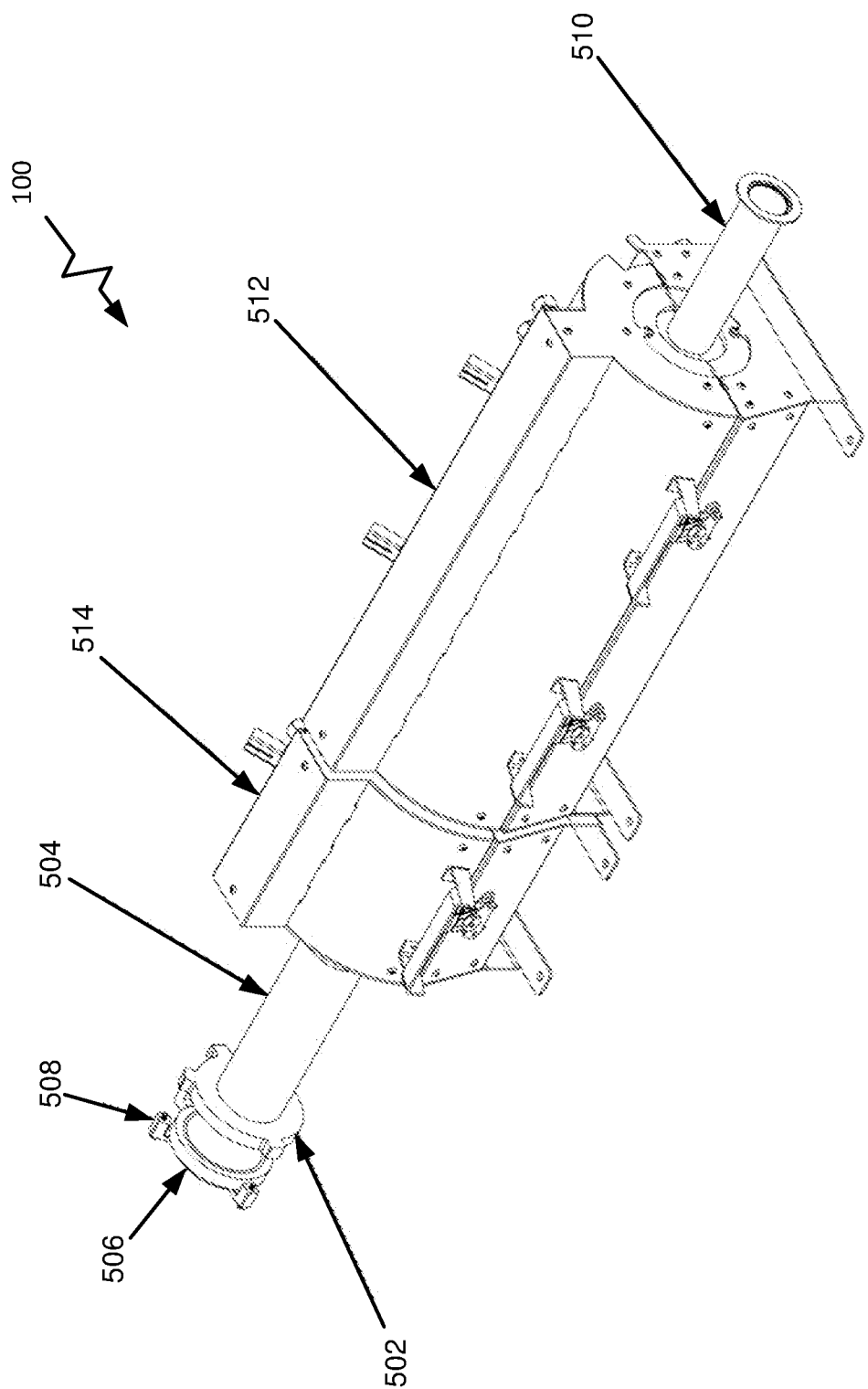
FIG. 5 is a diagrammatic view illustrating a reactor assembly of the device in accordance with the present invention.

Referring now to FIG. 5, which illustrates the fourth assembly 408 of parts as illustrated and including the reactor and the chemical vapor deposition coating tool, additional components are described. This fourth assembly 408 further comprises a first sub-assembly 502 of parts including an inlet tube, a reactor. This fourth assembly 408 further comprises a second sub-assembly 504 of parts including a vaporizer. This fourth assembly 408 further comprises a third sub-assembly 506 of parts including a clamp, door, input, reactor, tube. This fourth assembly 408 further comprises a fifth sub-assembly 510 of parts including a tube, ceramics, a reactor outlet. This fourth assembly 408 further comprises a sixth sub-assembly 512 and 514 of parts including heaters for the reactor, and a vaporizer.

Figure 6:
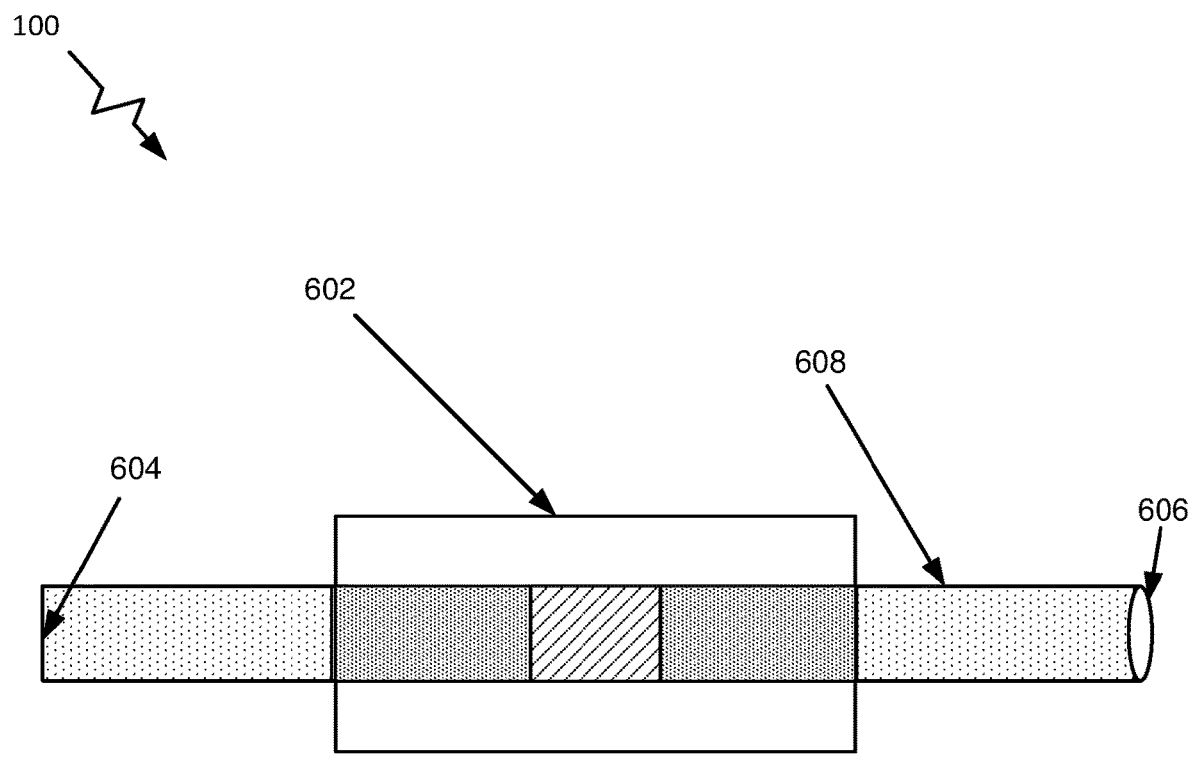
FIG. 6 is a schematic representation of an example tubular thermal reactor ("pyrolyzer") design for parylene thin film deposition. The different patterns/gradients in FIG. 6 illustrate the temperature variations across the inner pyrolysis core.

Referring now to FIG. 6, the hardware design of the thermal reactor comprises a main furnace heater 602, which surrounds a vapor inlet connection 604 passing to an outlet connection 606 of a reactor tube 608. The different patterns/gradients in FIG. 6 illustrate the temperature variations across the inner pyrolysis core.

Figure 7:
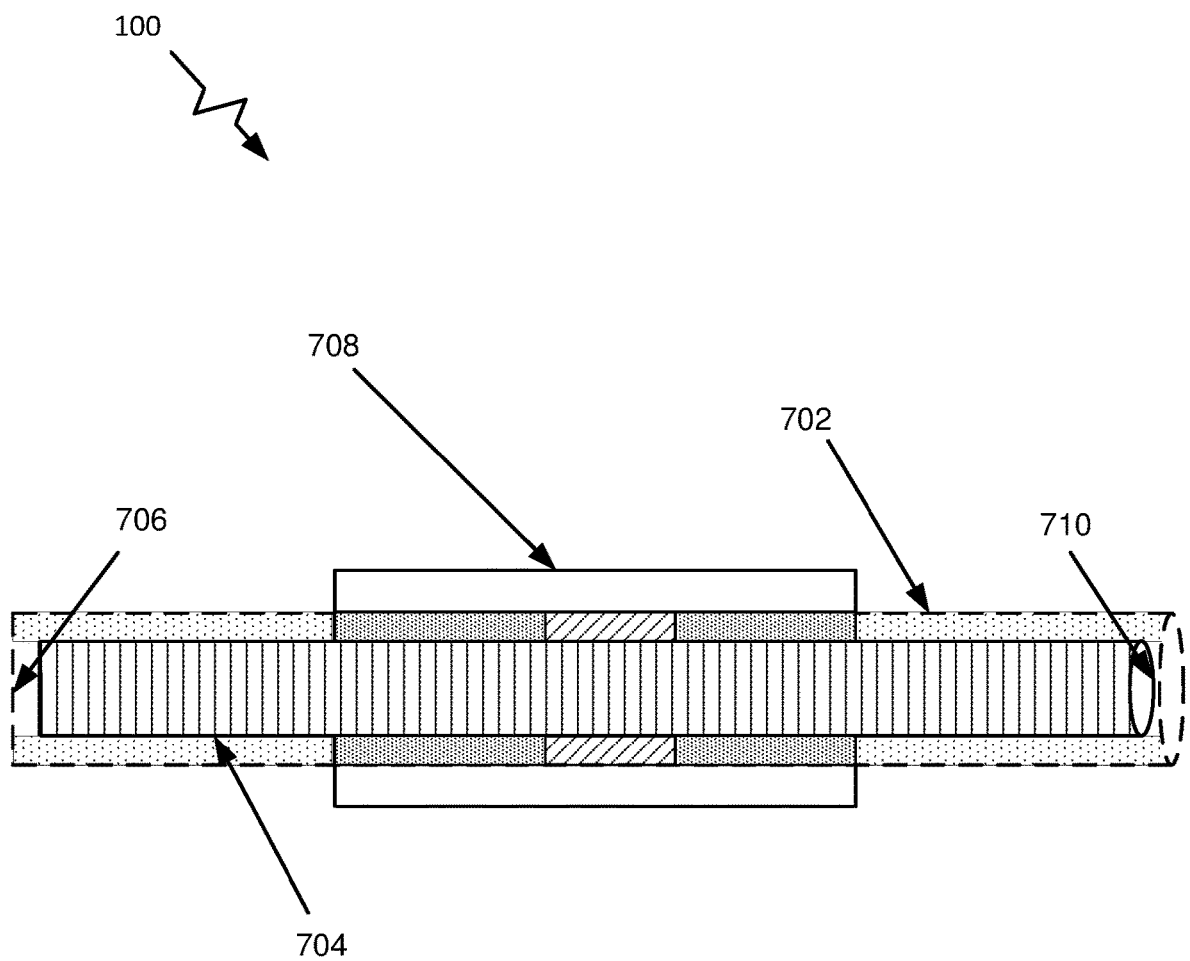
FIG. 7 is a schematic representation of an exemplary embodiment of an improved thermal reactor ("pyrolyzer") design for parylene thin film deposition. The different patterns/gradients in FIG. 7 illustrate the temperature variations across the inner pyrolysis core.

Referring now to FIG. 7, the hardware design further illustrates that there is an outer tube 702 (shown in broken lines), which forms an inner pyrolysis core 704. A vapor inlet connection 706 is illustrated at one end and an outlet connection 710 is illustrated at the other end. The main furnace heater 708 surrounds the inner pyrolysis core 704. The different patterns/gradients in FIG. 7 illustrate the temperature variations across the inner pyrolysis core.

Figure 8:
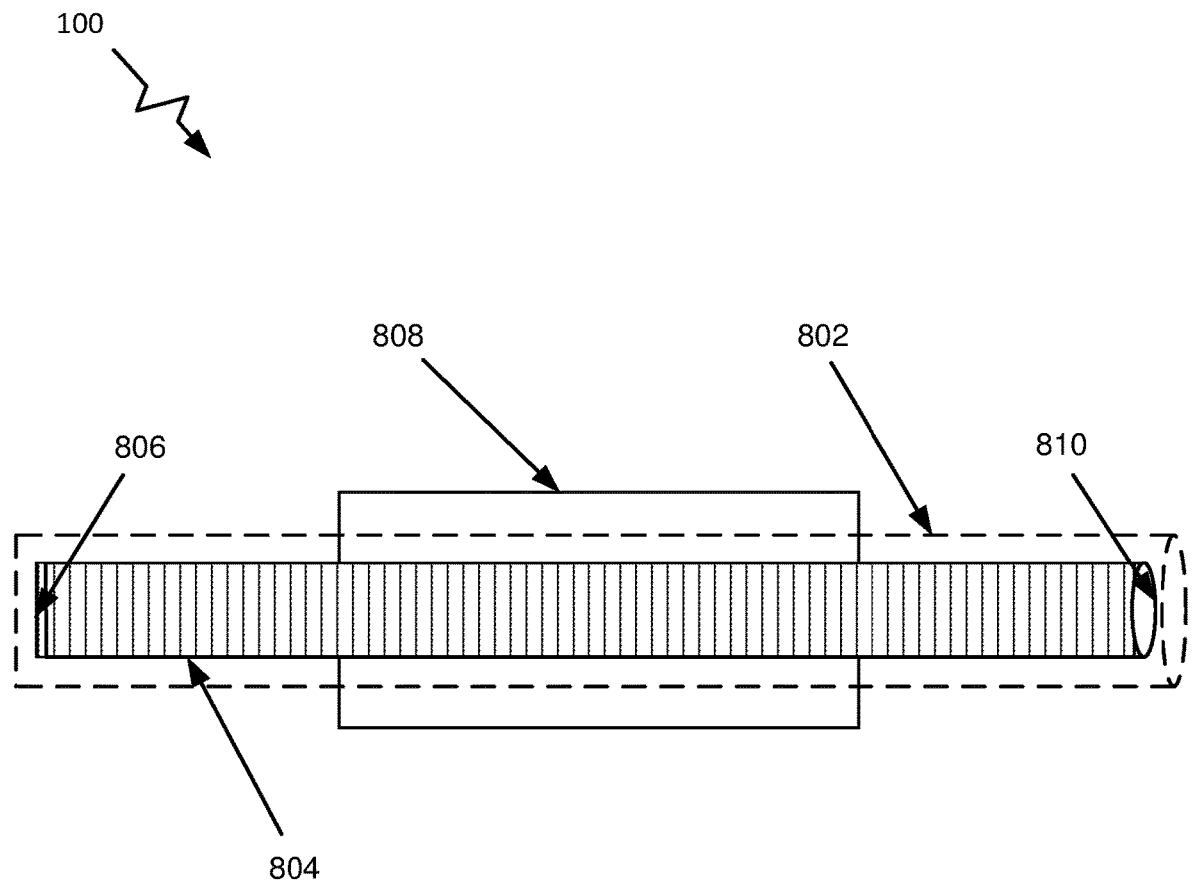
FIG. 8 is a schematic representation of an exemplary embodiment of another new reactor ("pyrolyzer") design for parylene thin film deposition. The different patterns/gradients in FIG. 8 illustrate the temperature variations across the inner pyrolysis core.

Referring now to FIG. 8, there is an outer tube 802, an inductively heated inner pyrolysis core 804, a vapor inlet connection 806, an inductive power source 808, an outlet connection 810. The different patterns/gradients in FIG. 8 illustrate the temperature variations across the inner pyrolysis core.

As described above, known commercial tubular thermal reactors, or pyrolyzers, like those used in deposition of parylene thin films from the precursor dimers, for e.g. $(CH_2-C_6H_4-CH_2)_2$ or other substituted dimers, typically consist of a solid pyrolysis tube (e.g., 608) that is either constructed from metal, metal alloys, or quartz. In some cases, the pyrolysis tube is made from metals or metal alloys that use a thin quartz liner to prevent any reaction between the precursor molecules and metal surface at elevated temperatures, which may result in undesirable impurities in the resulting films. The reactors are typically heated using an external heat source such as a furnace type heater (e.g., 602) covering the central zone of the tube 608 and operating between 600-750 C. The ends of the tubular reactors 604, 606 have to be normally maintained at temperatures less than 200 C, mostly less than 100 C, to ensure that vacuum coupling seals that connect the pyrolysis tube to the deposition chamber are not damaged. For a typical pyrolyzer length of 14-18 inches used in parylene deposition systems, this implies that the temperature variation from the center of the hot tubular zone to the ends is more than 400 C, which is typically too much positional variation for complete thermal cracking of the dimer molecules. Furthermore, the presence of quartz liners inside the metal pyrolysis tube results in ever higher temperature gradients across the inner section (reaction zone) of the pyrolysis tube, as quartz has poor thermal conductivity. Thus, adding even more inefficiency to the dimer conversion process. In the new design, one way to solve this problem is to heat the pyrolysis tube 608 to a higher temperature, for example 800 degrees Celsius or higher. This may achieve higher degree of precursor cracking. However, at the higher temperatures within the pyrolysis tube 608, other bonds besides the dimer bonds likely break. This causes the formation of thick carbon deposits ("coke") within the pyrolysis tube 608, which degrade the reactor performance and results in incomplete dimer to reactive monomer conversion. Large amounts of carbon deposits necessitate frequent cleaning of the reactor resulting in frequent maintenance cycles for the equipment. Furthermore, the breaking of other bonds besides the dimer bond may result in a variety of different reactive intermediates being introduced into deposition chamber, and thus may result in unwanted cross-linking, the formation of many polymer chain ends, and other such problems. The resulting films may have poorer thermal stability and inferior electrical properties compared to the desired films.

Another way around this issue as performed by the present design is to increase the overall length of the reactor to ensure that a large section of the pyrolysis tube 608 is heated to a constant temperature in the range of 600-750 C, resulting in a more efficient dimer conversion. In some instances, this approach results in a large centrally heated zone that wastes lot of heating energy and the overall equipment footprint becomes excessively large. The present invention as illustrated describe a new reactor design that consists of an inner heated pyrolysis core with a near constant temperature distribution for that spans almost the entire length of the pyrolyzer unit. The presence of a longer, uniformly heated reaction zone results in more efficient chemical bond breaking thus avoiding some of the issues mentioned previously.

Referring now to FIG. 7, which illustrates an embodiment of the apparatus and process, the apparatus 100 has a design with an externally heated reactor core. In this design, as illustrated, the pyrolyzer unit consists of an inner pyrolysis core 704 that is constructed from high thermal conductivity material (ceramic, metal, metal alloys, or other engineered materials) that does not chemically react with the flowing vapor molecules at pyrolyzer operating temperatures. The inner pyrolysis core is vacuum insulated from the outer tube 702 at both ends 706 and 710 of the main outer tube by machining a small gap between the inner core and outer tube. The extremely fine gap minimizes the vapor flow in the annular region while eliminating any conductive heat transfer. The center section of the core material is machined to be perfect fit to the outer tube to allow for conductive heat transfer from outer tube section that is heated by the furnace heater. Also, the center portion of the inner core is fabricated to form a high absorption outer surface allowing for efficient radiative heat transfer from the heated outer core, which is heated by the furnace heater 708. In contrast, the zones outside the main heated zone can be made of low emissivity materials, minimizing radiative heat loss. This can be achieved by a combination of the choice of core material and surface processing techniques.

Yet another important consideration in this design is the thermal conductivity and thermal mass of the inner core material. The use of high thermal conductivity materials with a high thermal mass of the inner pyrolysis core allows a uniformly heated reaction section across the pyrolysis tube. It should be recognized that in conventional pyrolyzer units where the quartz liners are used, the main purpose of the liner is to avoid chemical reaction of the vapor molecules with the outer metal tube and no consideration is given to the thermal properties of the liner material. Poor thermal conductivity of the quartz liner still results in high temperature gradient between the center section and the end pyrolysis zones.

Referring again to FIG. 8, which illustrates a second embodiment of the hardware design, a microwave heated reactor core is illustrated. In this design, as shown, the pyrolyzer unit consists of an inner pyrolysis core 804 that is constructed from a material that allow inductive coupling to an external power source 808. The external power source can be, but not limited to, induction, RF, or microwave sources. The outer tube 802 in this embodiment is made from a material that does not couple with the external power source, allowing the outer tube to operate at or near room temperature when the inner core is heated to reaction temperatures required for chemical bond breaking.

The inner pyrolysis core 804 is vacuum insulated from the outer tube 802 at both ends 806 and 810 of the main outer tube by machining a small gap between the inner core and outer tube. The extremely fine gap minimizes the vapor flow in the annular region while eliminating any conductive heat. The inner pyrolysis core can be constructed from high thermal conductivity material (ceramic, metal, metal alloys, or other engineered materials) that does not chemically react with the flowing vapor molecules at pyrolyzer operating temperatures.

In the following description, for purposes of explanation, numerous specific details are set forth in order to provide a thorough understanding of this technology. It will be apparent, however, that this technology can be practiced without some of these specific details. In other instances, structures and devices are shown in block diagram form in order to avoid obscuring the innovative aspects. For example, the present technology is described in some implementations below with reference to particular hardware and may be used with software systems.

Reference in the specification to "one implementation or embodiment" or "an implementation or embodiment" simply means that a particular feature, structure, or characteristic described in connection with the implementation or embodiment is included in at least one implementation or embodiment of the technology described. The appearances of the phrase "in one implementation or embodiment" in various places in the specification are not necessarily all referring to the same implementation or embodiment.

The foregoing description of the embodiments of the present invention has been presented for the purposes of illustration and description. It is not intended to be exhaustive or to limit the present invention to the precise form disclosed. Many modifications and variations are possible in light of the above teaching. It is intended that the scope of the present inventive technology be limited not by this detailed description, but rather by the claims of this application. As will be understood by those familiar with the art, the present inventive technology may be embodied in other specific forms without departing from the spirit or essential characteristics thereof. Likewise, the particular naming and division of the features, attributes, methodologies and other aspects are not mandatory or significant, and the mechanisms that implement the present inventive technology or its features may have different names, divisions and/or formats. Accordingly, the disclosure of the present inventive technology is intended to be illustrative, but not limiting, of the scope of the present invention, which is set forth in the following claims.

What is claimed is:

1. An apparatus for performing a chemical vapor deposition of thin film, comprising:
   a vacuum-insulated inner core with an inlet connected to a vapor inlet source and an outlet connected to at least one of a deposition chamber and secondary reactor unit, wherein the vacuum-insulated inner core forms an inner pyrolysis core;
   an outer tube spaced apart from and configured to surround the vacuum-insulated inner core and wherein the inner pyrolysis core is vacuum insulated from the outer tube at both ends of the outer tube by a gap between the inner pyrolysis core and the outer tube and wherein the gap is sized to minimize vapor flow in an annular region and eliminate any conductive heat transfer;
   and a heating element configured to inductively and uniformly heat the vacuum-insulated inner core to high temperatures of 800 degrees C. or higher by an external energy source, required for breaking of chemical bonds by triggering a chemical reaction in the central zone configured to transform the first type of vapor flow of incoming precursor into a second type of vapor flow of reactive intermediates that are transported to a vacuum chamber for depositing thin films including parylene polymer films.

2. The apparatus according to claim 1, wherein the thin film is parylene, and wherein the parylene is deposited using at least one of a solid dimer and a liquid precursor source and wherein the parylene is applied to an electrical circuit to provide protection against corrosion and chemical attack or moisture.

3. The apparatus according to claim 1, wherein the vacuum-insulated inner core that is inductively and uniformly heated, has an inlet that is connected to a vapor inlet source and an outlet connected to at least one of the deposition chamber and the secondary reactor unit.

4. The apparatus according to claim 3, wherein the inner pyrolysis core is vacuum insulated from the outer tube and wherein the outer tube is constructed from a material that does not couple to the external energy source, wherein the outer tube operates at or near room temperature when the inner core is heated to a reaction temperature required for chemical bond breaking.

5. The apparatus according to claim 4, wherein inner pyrolysis core is vacuum insulated from the outer tube at both ends of the outer tube by the gap located between the inner pyrolysis core and the outer tube.

6. The apparatus according to claim 5, wherein the gap as sized minimizes the vapor flow of the parylene precursor molecules.

7. The apparatus according to claim 6, wherein a center section of the inner pyrolysis core is serves as a machined component required to fit within the outer tube allowing conductive heat transfer from an outer tube section that is heated by the heating element.

8. An apparatus for performing a chemical vapor deposition of thin film, comprising:
   a vacuum-insulated inner core with an inlet that is connected to a vapor inlet source and an outlet connected to at least one of a deposition chamber and a secondary reactor unit, wherein the vacuum-insulated inner core forms a radiatively-heated inner pyrolysis core;
   an outer tube spaced apart from and configured to surround the vacuum-insulated inner core and wherein the radiatively-heated inner pyrolysis core is vacuum insulated from the outer tube at both ends of the outer tube by a gap between the radiatively-heated inner pyrolysis core and the outer tube, wherein a center portion of the radiatively-heated pyrolysis core comprises a high absorption outer surface allowing radiative heat transfer from a heated outer zone to an outside zone made of a low emissivity material to minimize radiative heat loss and wherein the gap is sized to minimize a first type of vapor flow of incoming precursor molecules in an annular region and eliminate any conductive heat transfer; and
   a furnace configured to surround a central zone of the outer tube and uniformly heat the vacuum-insulated inner core to a temperatures level causing a chemical reaction in the central zone transforming the first type of vapor flow of incoming precursor molecules into a second type of vapor flow of reactive intermediates by breaking of chemical bonds in the first type of incoming precursor molecules and resulting in generating the vapor flow of reactive intermediates that are transported to a vacuum chamber for depositing thin films including parylene polymer films, and wherein a parylene thin film is deposited using at least one of a solid dimer and a liquid precursor source and wherein the parylene thin film is applied to an electrical circuit to provide protection against corrosion and chemical attack or moisture and wherein the ends of the secondary reactor unit are maintained at a temperature less than 100 C.

9. The apparatus according to claim 8, wherein the vacuum-insulated inner core that is the radiatively-heated inner pyrolysis core is a high thermal conductivity material configured not to chemically react with the flowing vapor molecules at pyrolyzer operating temperatures and wherein a high thermal mass of the inner pyrolysis core allows a uniformly heated reaction section across a pyrolysis tube.

10. The apparatus according to claim 9, wherein the radiatively-heated inner pyrolysis core is constructed from at least one of a ceramic, a metal, and metal alloys.

* * * * *